(12) United States Patent
Osipov et al.

(10) Patent No.: US 6,993,056 B2
(45) Date of Patent: Jan. 31, 2006

(54) HETERO LASER AND LIGHT-EMITTING SOURCE OF POLARIZED RADIATION

(75) Inventors: Viatcheslav V. Osipov, Mountain View, CA (US); Alexandre M. Bratkovski, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 337 days.

(21) Appl. No.: 10/387,480

(22) Filed: Mar. 14, 2003

(65) Prior Publication Data

US 2004/0179567 A1  Sep. 16, 2004

(51) Int. Cl.
*H01S 5/00*  (2006.01)
(52) U.S. Cl. .............................. 372/46.015; 372/43.01; 372/44.01
(58) Field of Classification Search ............ 372/43–46, 372/43.01, 44.01, 45.01, 46.016
See application file for complete search history.

(56) References Cited

U.S. PATENT DOCUMENTS 5,060,234 A * 10/1991 Schubert et al. .............. 372/45
6,774,446 B2 *  8/2004 Osipov et al. .............. 257/421
6,809,388 B2 * 10/2004 Ossipov et al. ............. 257/421

OTHER PUBLICATIONS

J.D. Albrecht et al., "Electron Spin Injection at a Schottky Contact," Physical Review B, vol. 66, 113303 (Feb. 7, 2002).*
H.J. Zhu et al., "Room-Temperature Spin Injection from Fe into GaAs," Physical Review Letters, vol. 87, No. 1 (Jul. 2, 2001).*

* cited by examiner

Primary Examiner—Minsun Oh Harvey
Assistant Examiner—James Menefee

(57) ABSTRACT

A device and method for hetero laser and light-emission of high polarization radiation. Previous light emitting devices suffered from very low degree of the radiation polarization. A hetero laser and light emitting device with a semiconductor layer sandwiched between δ-doped layers and ferromagnets allows for highly polarized light to be emitted.

34 Claims, 15 Drawing Sheets

| CONTACT | 350 |
| --- | --- |
| FM1 | 370 |
| $\delta_1$ | 315 |
| $S_1$ | 310 |
| $\delta_2$ | 325 |
| $S_2$ | 320 |
| $S_3$ | 330 |
| SUBSTRATE | 340 |
| CONTACT | 360 |

FIG. 4C

| | |
|---|---|
| $\delta_1$ | 315 |
| $S_1$ | 310 |
| $\delta_2$ | 325 |
| $S_2$ | 320 |
| $S_3$ | 330 |
| FM2 / CONTACT | 360 |
| SUBSTRATE | 340 |

*FIG. 5B*

| | |
|---|---|
| CONTACT | 350 |
| FM1 | 370 |
| $\delta_1$ | 315 |
| $S_1$ | 310 |
| $\delta_2$ | 325 |
| $S_2$ | 320 |
| $S_3$ | 330 |
| FM2 / CONTACT | 360 |
| SUBSTRATE | 340 |

HETERO LASER AND LIGHT-EMITTING SOURCE OF POLARIZED RADIATION

RELATED APPLICATIONS

The following applications of the common assignee, which are hereby incorporated by reference in their entirety, may contain some common disclosure and may relate to the present invention:

U.S. patent application Ser. No. 10/284,360, entitled "EFFICIENT SPIN INJECTION INTO SEMICONDUCTORS"; and U.S. patent application Ser. No. 10/284,183, entitled "MAGNETIC SENSOR BASED ON EFFICIENT SPIN INJECTION INTO SEMICONDUCTORS".

FIELD OF THE INVENTION

This invention relates generally to spintronics and photonics. In particular, the invention relates generally to injection hetero lasers and light-emitting diodes, i.e., source of stimulated and spontaneous polarized light, based on solid-state heterostructures and efficient spin injection into semiconductors, especially at room temperature.

BACKGROUND OF THE INVENTION

Over the past decade a pursuit of solid state ultrafast scaleable devices based on both the charge and spin of an electron has led to a development of new fields of magnetoelectronics and spintronics. The discovery of giant magnetoresistance (GMR) in magnetic multilayers has quickly led to important applications in storage technology. GMR is a phenomenon where a relatively small change in magnetism results in a large change in the resistance of the material.

The phenomenon of a large tunnel magnetoresistance ("TMR") of ferromagnet-insulator-ferromagnet ("$F_1$-I-$F_2$") structures is a focus of product development teams in many leading companies. TMR is typically observed in $F_1$-I-$F_2$ structures made of two ferromagnetic layers, $F_1$ and $F_2$, of similar or different materials separated by the insulating thin tunnel barrier I with thickness typically ranging between 1.4–2 nm.

It is worth mentioning recent studies of the giant ballistic magnetoresistance of Ni nanocontacts. Ballistic magnetoresistance is observed in Ni and some other nanowires where the typical cross-section is a few square nanometers. The transport in this case is through very short constriction made on the vicinity of the nanowire and it is thought to proceed with conservation of electron momentum (ballistic transport). The change in the contact resistance can exceed 10 fold (or over 1000%).

Of particular interest has been the injection of spin-polarized carriers, mainly in the form of spin-polarized current into semiconductors. This is significant due to relatively large spin-coherence lifetime of electrons in semiconductors, including possibilities for use in hetero laser and light-emitting diodes of polarized radiation. Development of sources of stimulated and spontaneous polarized radiation, i.e., laser and a light-emitting diode of polarized light is one of the most urgent problems of optical communication. Conventional sources have low degree of polarization.

FIG. 1A illustrates a schematic prototypical model of a conventional double hetero laser and light-emitting diode 100. As shown, the diode 100 includes a first semiconductor layer 110, a second semiconductor layer 120 below the first semiconductor layer 110, and a third semiconductor layer 130 below the second semiconductor layer 120. The diode 100 also includes a substrate 140 below the third semiconductor layer 130 and first and second contacts 150 and 160 above the first semiconductor layer 110 and below the substrate 140, respectively.

The first semiconductor layer 110 is relatively heavily negatively doped ($n^+$) and the third semiconductor layer 130 is relatively heavily positively doped ($p^+$). The second semiconductor layer 120 may be either positively (p) or negatively (n) doped, but as a rule, the dopant concentration level is less than that of the first or the third semiconductor layers 110 or 130. Main feature of the double heterostructure is that the second semiconductor layer 120 has the narrower band gap when compared to the band gaps of the adjacent first and second semiconductor layers 110 and 130.

FIG. 1B illustrates an energy band diagram of the diode 100 illustrated in FIG. 1A along the line I—I at equilibrium. In this figure, the Fermi level $E_F$, the bottom conduction band energy level $E_C$, and the top valence band energy level $E_V$ are shown. Also, the energy band gaps for each material $E_{g1}$ (first semiconductor layer 110), $E_{g2}$ (second semiconductor layer 120), and $E_{g3}$ (third semiconductor layer 130) are shown where $E_{gi}=E_{Ci}-E_{Vi}$ for each layer, i=1–3. As mentioned above, $E_{g2}<E_{g1}$, $E_{g3}$.

FIG. 1C shows the same as FIG. 1B, but at a large bias. Radiation in the diode 100 is generated as a result of radiative recombination of non-equilibrium electrons and holes in the second semiconductor layer 120. The electrons and holes are injected into the second semiconductor layer 120 (which has narrower band gap) from first and third semiconductor layers 110 and 130, respectively. The electrons and holes are only slightly spin-polarized (due to weak spin-orbital coupling) in the conventional light-emitting heterostructure such as the diode 100. Consequently, the radiation has a very low degree of polarization.

The possibility of spin injection from ferromagnetic semiconductors (FMS) into nonmagnetic semiconductors has been demonstrated in a number of recent publications. However, the Curie temperature (the temperature above which a material becomes nonmagnetic) of magnetic semiconductors is substantially below room temperature. The low Curie temperature limits possible applications. Room-temperature spin injection from ferromagnets (FM) into semiconductors has also been demonstrated, but its efficiency is very low (~1–2%).

The main problem of the spin injection from a ferromagnet into semiconductor is that a potential barrier (Schottky barrier with the height Δ) for carriers always forms in the semiconductor near the metal-semiconductor interface due to different values of the electrode work function and the affinity of a semiconductor. Numerous experiments have shown that the barrier height Δ is determined by surface states forming at the interface, which is approximately (⅔)$E_g$ almost independent of the type of a metal, where $E_g$ is the energy band gap of the semiconductor. For example, in GaAs $E_g$≈1.42 eV and Δ≈0.8–1.0 eV, in the case of Si $E_g$=1.12 eV and Δ≈0.6–0.8 eV.

SUMMARY OF THE INVENTION

According to an embodiment of the present invention, a hetero-laser and light-emitting device comprises a first semiconductor layer being doped with a first dopant type; a second semiconductor layer being doped with a second dopant type and being formed below the first semiconductor layer; a third semiconductor layer being doped with the second dopant type and being formed below the second semiconductor layer; a ferromagnetic layer formed above the first semiconductor layer; a first δ-doped semiconducting layer being doped with the first dopant type and being formed between the ferromagnetic layer and the first semiconductor layer; and a second δ-doped semiconducting layer being doped with the first dopant type and being formed between the first semiconductor layer and the second semiconductor layer.

According to another embodiment of the present invention, a method to form a hetero-laser and light-emitting device comprises forming a first semiconductor layer doped with a first dopant type; forming a second semiconductor layer doped with a second dopant type and located below the first semiconductor layer; forming a third semiconductor layer doped with the second dopant type and located below the second semiconductor layer; forming a ferromagnetic layer above the first semiconductor layer; forming a first δ-doped layer doped with the first dopant type and located between the ferromagnetic layer and the first semiconductor layer; and forming a second δ-doped layer doped with the first dopant type and located between the first semiconductor layer and the second semiconductor layer.

According to a further embodiment of the present invention, a method of emitting polarized light comprises providing a hetero-laser and light-emitting device, wherein the devices comprises a first semiconductor layer doped with a first dopant type, a second semiconductor layer being doped with a second dopant type and located below the first semiconductor layer, a third semiconductor layer being doped with the second dopant type and located below the second semiconductor layer, a ferromagnetic layer above the first semiconductor layer, a first δ-doped layer doped with the first dopant type and located between the ferromagnetic layer and the first semiconductor layer, and a second δ-doped layer doped with the first dopant type and located between the first semiconductor layer and the second semiconductor layer; and applying a bias voltage between the ferromagnetic layer and the substrate.

BRIEF DESCRIPTION OF THE DRAWINGS

Features of the present invention will become known from the following description with reference to the drawings, in which:

FIGS. 4A–4C illustrate an exemplary method of manufacturing the hetero laser and light-emitting device shown in FIG. 3A according to an embodiment of the present invention; and FIGS. 5A–5E illustrate an exemplary method of manufacturing the hetero laser and light-emitting device shown in FIG. 3F according to an embodiment of the present invention.

DETAILED DESCRIPTION

For simplicity and illustrative purposes, the principles of the present invention are described by referring mainly to exemplary embodiments thereof. In the following description, numerous specific details are set forth in order to provide a thorough understanding of the present invention. However, the present invention may be practiced without limitation to these specific details. In other instances, well known methods and structure have not been described in detail so as not to unnecessarily obscure the present invention.

Figure 1A:
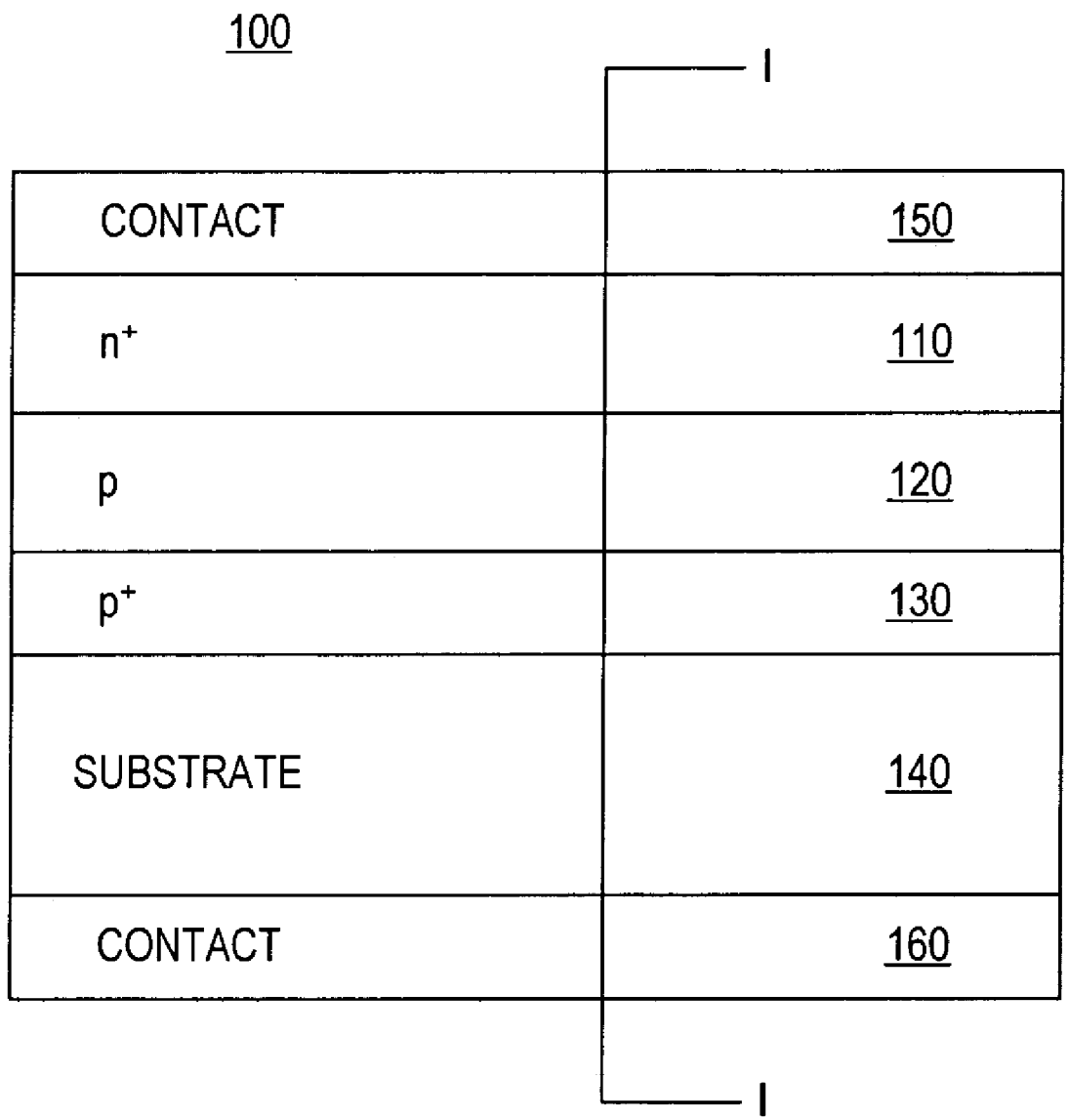
FIG. 1A illustrates a schematic of a conventional double hetero laser and light-emitting diode.
Figure 1B:
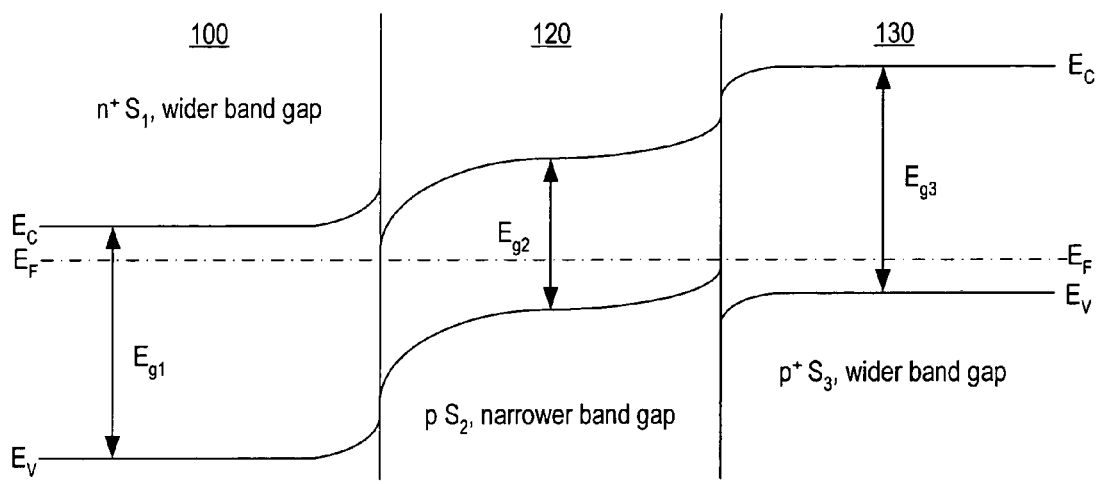
FIG. 1B illustrates an energy band diagram of the double hetero laser and light-emitting diode shown in FIG. 1A along the line I—I at equilibrium.
Figure 1C:
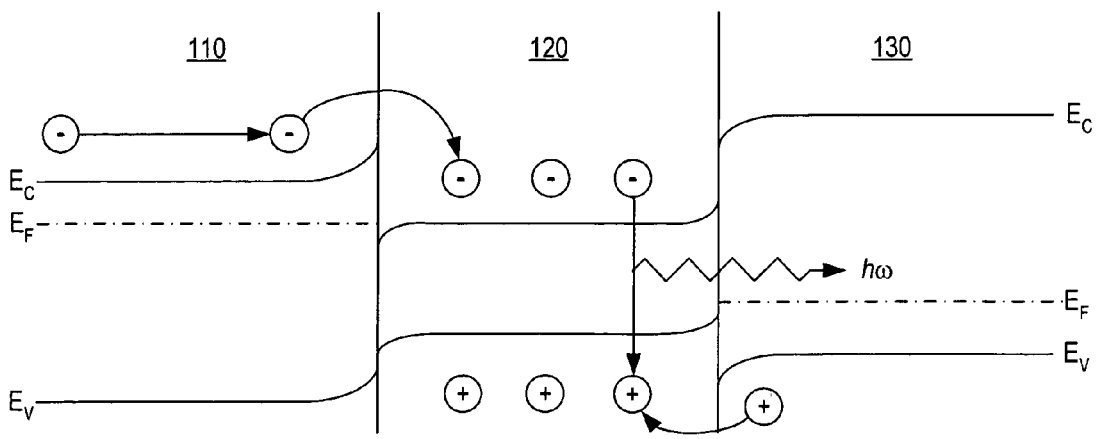
FIG. 1C illustrates an energy band diagram of the double hetero laser and light-emitting diode shown in FIG. 1A along the line I—I when a relatively large bias voltage is applied to the diode.
Figure 2A:
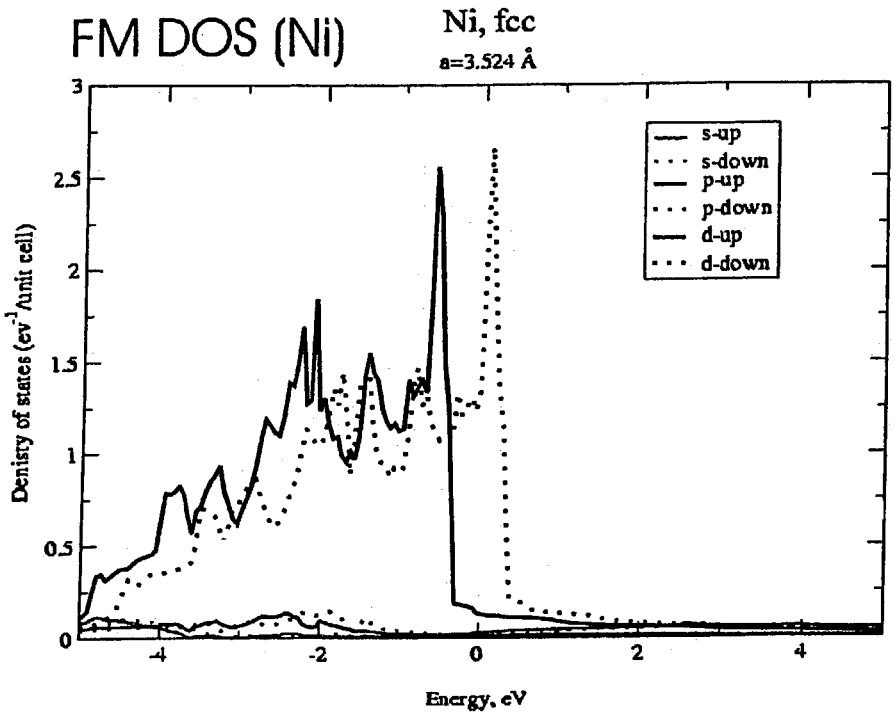
FIG. 2A illustrates a density of electronic states (DOS) of ferromagnetic Ni.

The density of states ("DOS") is one of main characteristics of electrons in solid states, in particular, in magnetic materials, such as ferromagnetic Ni, Co, and Fe. DOS is defined as $g_i(E)dE$, which is the number of electron states characterized by some quantum number i per unit volume in an energy interval (E, E+dE). FIG. 2A illustrates the DOS of ferromagnetic Ni, where arrows indicate the DOS for majority (d-electrons with spin up ↑, d↑) and minority (spin down, d↓) electrons, together with the DOS for s- and p-electrons. Note that the DOS have high peaks for both spin-up and spin-down electrons at certain energy intervals.

Figure 2B:
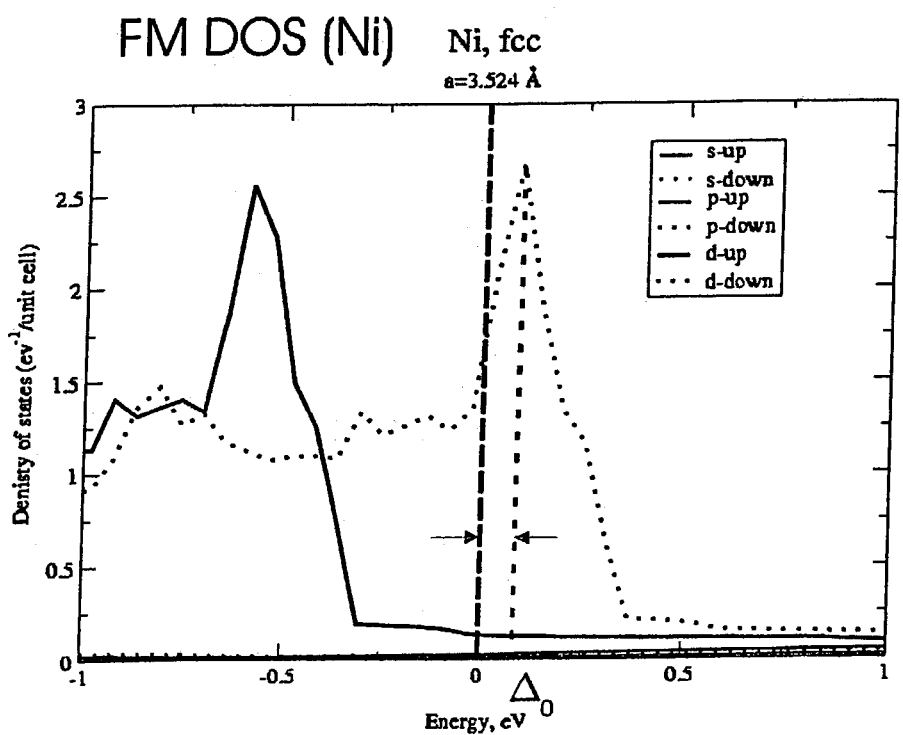
FIG. 2B illustrates the density of electronic states (DOS) of ferromagnetic Ni, but at a higher resolution than in FIG. 2A.

FIG. 2B illustrates the DOS of ferromagnetic Ni, but at a higher resolution than in FIG. 2A. The energy origin is chosen at the Fermi level $E_F$, i.e. $E=E_F=0$. As shown, there is a very large difference in the DOS of minority and majority d-electrons at E>0 (states above the Fermi level). The peak in the DOS of minority d-electron states is positioned at $E=\Delta_0$, which for Ni, $\Delta_0 \approx 0.1$ eV. Similar region at E>0 exists in Co and Fe. Note that near $E \approx \Delta_0$, the DOS of the majority d-electrons and DOS of s- and p-electrons are all negligible when compared with the DOS of minority d-electrons. Thus, if electrons are injected from the ferromagnetic material with energies $E \approx \Delta_0$, the electrons would be almost 100% polarized.

Figure 3A:
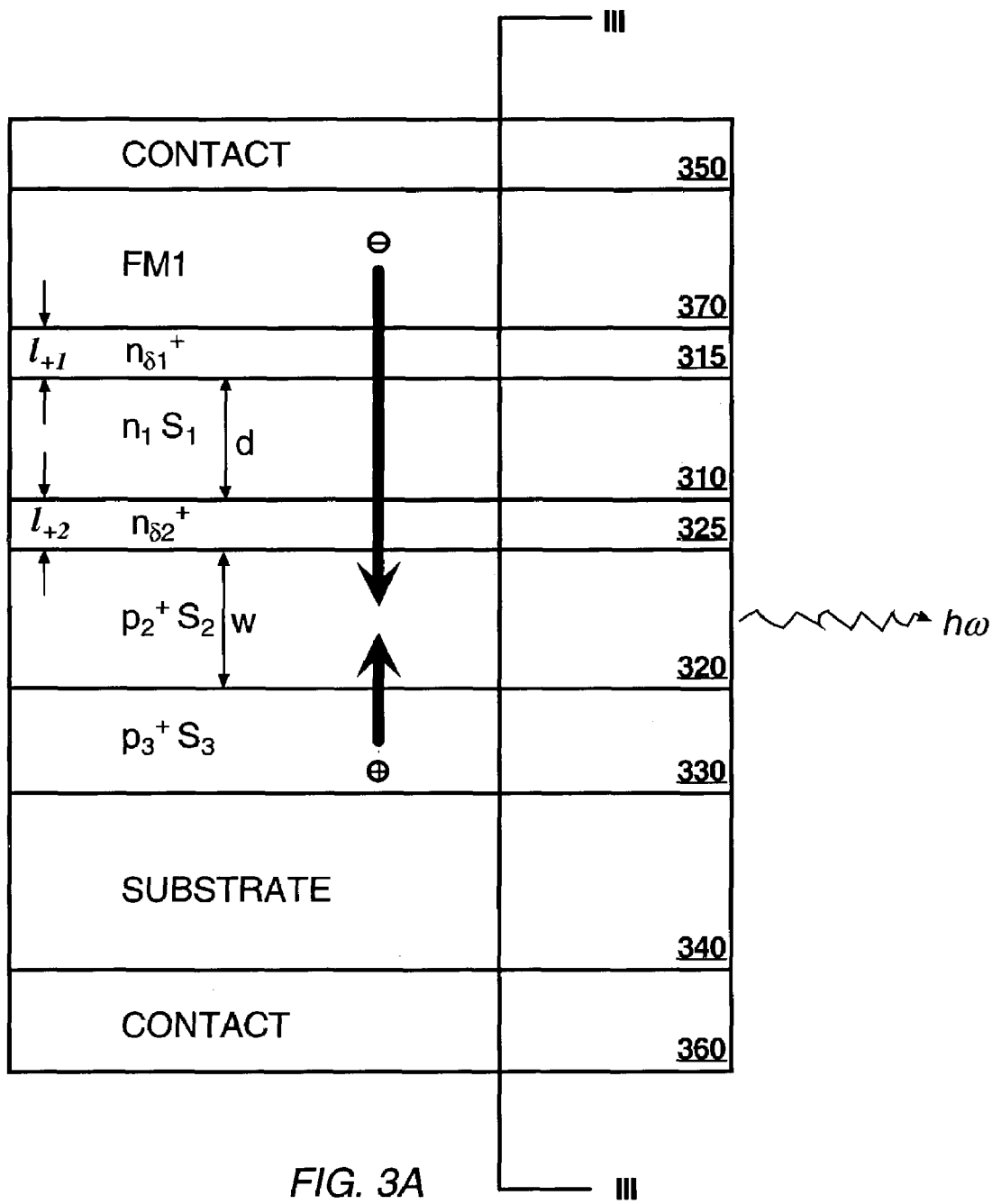
FIG. 3A illustrates a hetero laser and light-emitting device according to an embodiment of the present invention.

FIG. 3A illustrates a hetero laser and light-emitting device 300 according to an embodiment of the present invention. As shown, the device 300 may include a first semiconductor layer 310, a second semiconductor layer 320 below the first semiconductor layer 310, and a third semiconductor layer 330 below the second semiconductor layer 320. The device 300 may also include a magnetic layer 370 above the first semiconductor layer 310, a first δ-doped semiconductor layer 315 between the magnetic layer 370 and the first semiconductor layer 310, and a second δ-doped semiconductor layer 325 between the first semiconductor layer 310 and the second semiconductor layer 320. The device 300 may further include a substrate 340 below the third semiconductor layer 330, and first and second contacts 350 and 360 above the magnetic layer 370 and below the substrate 340, respectively.

Figure 3B:
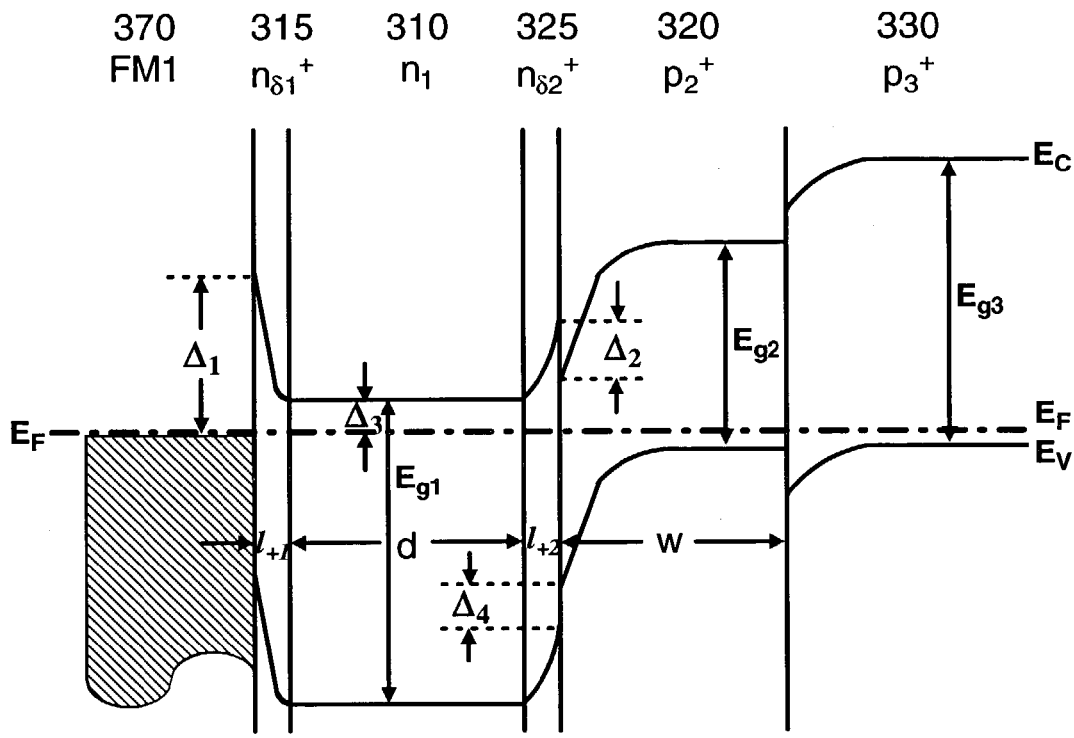
FIG. 3B illustrates an exemplary energy diagram of the device shown in FIG. 3A along the line III—III, at equilibrium.

The first semiconductor layer 310 may be relatively heavily negatively doped ($n^+$), and both the second and third semiconductor layers 320 and 330 may be relatively heavily positively doped ($p^+$). In an embodiment, the energy band gap of the second semiconductor layer 320, $E_{g2}$, is less than the energy band gaps of the first or third semiconductor layers 310 or 330, $E_{g1}$ or $E_{g3}$ as shown in FIG. 3B.

The second semiconductor layer 320 may be formed from semiconductors with direct optical transitions. In such semiconductors, an electron can directly recombine with a hole without emitting/absorbing photon. Second semiconductor layer 320 may be formed, for example, from materials such as GaAs, AlGaAs, InGaAs, InGaPAs, InAs, GaSb, InSb, InGaSb, AlAs, AlSb, ZnTe, CdTe, HgCdTe, and alloys which may include various combinations of these materials.

In an embodiment, the thickness w of the second semiconductor layer 320 is less than a diffusion length of non-equilibrium carriers in this layer. The majority semiconductors with direct optical transitions, such as the ones listed above, may be characterized by two types of holes: light holes with an effective mass $m_{pl}$ and heavy holes with an effective mass $m_{ph} \gg m_{pl}$. The light and heavy holes may be typically characterized by different effective spin projections, $$\mu_{hl} = \pm \frac{1}{2} \text{ and } \mu_{hh} = \pm \frac{3}{2}.$$

Therefore, during recombination of the holes with the spin-polarized electrons (with $\mu_e = \frac{1}{2}$)

the light is generated with polarization P=±1.

In an embodiment, to increase the degree of the radiation polarization, one type of the holes, such as the light holes, are excluded from the recombining. This may be achieved by means of size quantization of the hole levels in the second semiconductor layer 320, which is a "quantum well". (See FIG. 3C). Reducing the thickness w of the second semiconductor layer 320 achieves appreciable quantization of energy of the light holes in the potential well of the $p^+$ second semiconductor layer 320. The lower energy level may be higher than the thermal energy $k_B T$, where T is the temperature and $k_B$ is the Boltzmann constant. Thus, the thickness w may satisfy the following conditions:

$$w < L_{D2} \quad (1)$$

and $$w_0 > w \geq w_0 \sqrt{m_{pl}/m_{ph}}, \text{ where } w_0 = h/\sqrt{2m_{pl}k_B T} \quad (2)$$

As noted above, the first semiconductor layer 310 may be relatively strongly negatively doped ($n^+$). Also as noted above, the first and third semiconductor layer 310 and 330 may have an energy band gaps that is wider than the energy band gap of the second semiconductor layer 320, i.e. $E_{g1} > E_{g2}$, $E_{g3} > E_{g2}$. One way to accomplish this is to form the first, second, and third semiconductor layers 310, 320, and 330 from double heterostructures. Examples of double heterostructures include $Al_y Ga_{1-y} As$—GaAs—$Al_x Ga_{1-x} As$ and $In_y Ga_{1-y} As$— InGaAs—$In_x Ga_{1-x} As$, where x and y refer to the chemical composition of the relevant materials. Typically, x≈0.125–0.2 and y≈0.2–0.3.

It is noted that various dopants may be used to dope the first, second, and third semiconductor layers 310, 320, and 330. Generally, various impurities may be used as electron donors and acceptors in different semiconductor materials. For the majority of direct-gap semiconductors such as GaAs, GaAsAl, InGaAs, Zn and Cd may be used to positively dope the second and third semiconductor layers 320 and 330. Also, materials such as Ge, Se, Te, Si, Pb, and Sn may be used to negatively dope the first semiconductor layer 310 made of the same compound semiconductors.

In an embodiment, the thickness d of the first semiconductor layer 310 be much smaller than the spin diffusion length of electrons in the first semiconductor layer 310 such that $d \ll L_{eS} = \sqrt{D_e \tau_{eS}}$, where $\tau_{eS}$ is the relaxation time of electron spin and $D_e$ is the electron diffusion coefficient of the first semiconductor layer 310.

The ferromagnetic layer 370 may be formed from various magnetic materials such as Ni, Fe and Co, as well as various magnetic alloys, which may include one or more combinations of Fe, Co, Ni. In an embodiment, the thickness of the ferromagnetic layer 370 is substantially at 4–6 nm or greater but also less than the typical width of magnetic domain wall.

Both the first and the second δ-doped layers 315 and 325 may be heavily negatively doped ($n^+$) and very thin (the conditions are described below). One or both of the δ-doped layers 315 and 325 may be formed by delta-doping portions of the first semiconductor layer 310. In other words, lower and upper portions of the first semiconductor layer 310 may be heavily doped with electron-rich materials. For example, if the first semiconductor layer 310 is formed from GaAs, materials such as Ge, Se, Te, Si, Pb, and Sn may be used as dopants.

The device 300 thus formed may be described as having a FM1-$n_{\delta 1}^+$-$n_1$-$n_{\delta 2}^+$-$p_2^+$-$p_3^+$ structure corresponding to the layers 370, 315, 310, 325, 320, and 330, respectively. An example of such structure is Ni-$n_{\delta 1}^+$-$Ga_{0.875}Al_{0.125}As$-$n_1$-$Ga_{0.875}Al_{0.125}As$-$n_{\delta 2}^+$-$Ga_{0.875}Al_{0.125}As$-$p_2^+$-GaAs-$p_3^+$-$Ga_{0.8}Al_{0.2}As$. In other words, in this example, the second semiconductor layer 320 is formed from GaAs. Also, the first and third semiconductor layers 310 and 330 and the first and second δ-doped layers 315 and 325 are all formed from GaAlAs with composition parameters x and y being 0.125 and 0.2, respectively. Other example structures include Ni—GaAs—GaAs—GaAs—$In_x Ga_{1-x} As$—GaAs; Ni—GaAs—GaAs—GaAs—$In_x Ga_{1-x} As$—GaAs; Ni(Fe)—CdTe—CdTe—CdTe—$Cd_x Hg_{1-x} Te$—CdTe; and Ni(Fe)—$Zn_x Cd_{1-x} Se$—ZnSe—$Zn_x Cd_{1-x} Se$—Zn—$Zn_y Cd_{1-y} Se$.

Figure 3C:
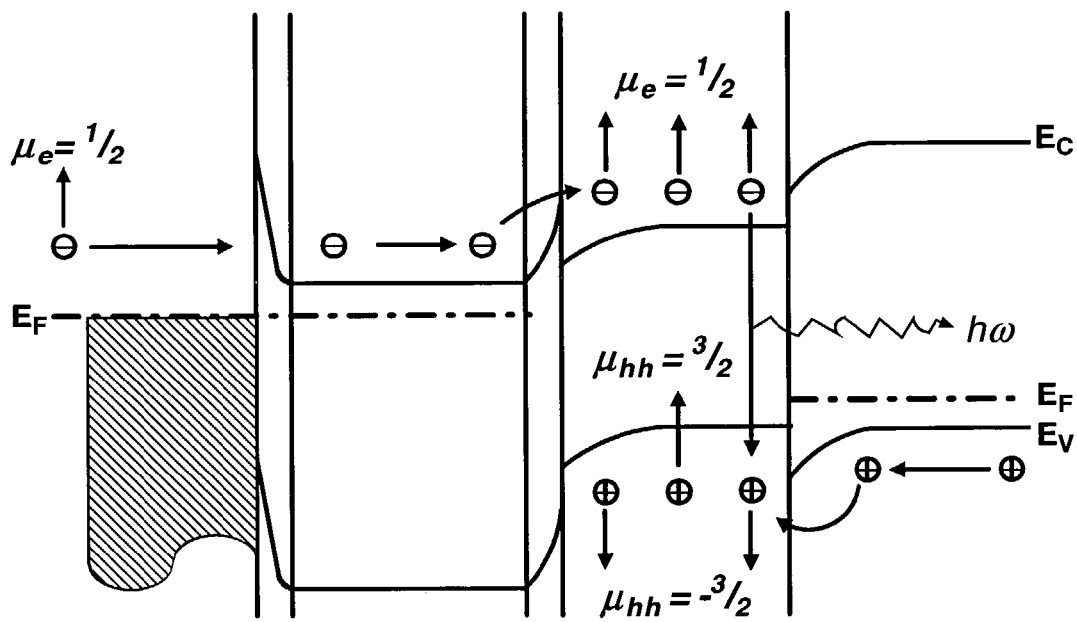
FIG. 3C illustrates an exemplary energy diagram of device shown in FIG. 3A along the line III—III, at bias.

FIGS. 3B and 3C illustrate exemplary energy diagrams of the device 300 shown in FIG. 3A along the line III—III, at equilibrium and at bias, respectively. In this embodiment, the first and second δ-doped layers 315 and 325 are assumed to be formed by delta-doping the respective portions of the first semiconductor layer 310. In FIG. 3B, the Fermi level $E_F$, the bottom conduction band energy level $E_C$, and the top valence band energy level $E_V$ are shown. The energy origin is chosen at the Fermi level, in other words, $E_F$ is defined to be at zero. Also, the energy band gaps for each material $E_{g1}$ (first semiconductor layer 310), $E_{g2}$ (second semiconductor layer 320), and $E_{g3}$ (third semiconductor layer 330) are shown where $E_{gi} = E_{Ci} - E_{Vi}$ for each layer. FIG. 3C shows the same as FIG. 3B, but under a bias voltage. It is clear from that the potential well forms in the second semiconductor layer 320 under bias voltage.

In an embodiment, the first δ-doped layer 315 screens the Schottky barrier at interface between the ferromagnetic layer 370 and the first semiconductor layer 310 so that it becomes transparent for tunneling electrons. In other words, the electrons may easily traverse the first δ-doped layer 315. The second δ-doped layer 325 may screen the interfacial potential barrier between the first and second semiconductor layers 310 and 320, so that it becomes transparent for tunneling electrons. If the following conditions are satisfied, the electrons may easily traverse the first and second δ-doped layers 315 and 325, i.e. be transparent:

$$N_{d1}l_{+1}^2 \approx 2\frac{\varepsilon_0\varepsilon(\Delta_1 - \Delta_3)}{q^2}, \quad l_{+1} \leq t_1 = \sqrt{\frac{\hbar^2}{2m^*(\Delta_1 - \Delta_3)}}, \quad (2)$$

$$N_{d2}l_{+2}^2 \approx 2\frac{\varepsilon_0\varepsilon\Delta_2}{q^2}, \quad l_{+2} \leq t_2 = \sqrt{\frac{\hbar^2}{2m^*\Delta_2}}, \quad (3)$$

where $N_{d1}$ and $N_{d2}$ represent donor concentrations of the first and second δ-doped layers 315 and 325, respectively; $l_{+1}$ and $l_{+2}$ represent the thicknesses of the first and second δ-doped layers 315 and 325, respectively; $\epsilon_0$ represents the permittivity of free space; $\epsilon$ represents a relative permittivity of the first semiconductor layer 310; $\Delta_1$ represents the height of the Schottky barrier (as measured from the Fermi level of the ferromagnetic layer 370) at the boundary between the ferromagnetic layer 370 and the first δ-doped layer 315; $\Delta_3$ represents the height of the lower and wider potential barrier in the first semiconductor layer 310 (also measured from Fermi level of the ferromagnetic layer 370); $\Delta_2$ represents the step of the potential barrier at the interface between the first and second semiconductor layers 310 and 320; q represents elementary charge; h is the Planck's constant, and m* represents an effective mass of electron of the first and second δ-doped layers 315 and 325. Typically, the thicknesses $l_{+1} \approx l_{+2} \approx (1-2)$ nm and the donor concentrations $N_{d1}$ and $N_{d2}$ may be greater than or substantially equal to $(10^{19}-10^{20})$ cm$^{-3}$.

The electrons that tunnel through the relatively high potential barrier $\Delta_1$ of the thin first δ-doped layer 315 with the energy $E > E_F$ face another potential barrier formed in the first semiconductor layer 310, which is shallow (barrier height $\Delta_3$) and much wider (of thickness, d>>$l_{+1}$). In an embodiment, the width d of the first semiconductor layer 310 be wide enough, yet d<<$L_{D1}$, where $L_{D1}$ is the diffusion length of carriers of the first semiconductor layer 310. When this occurs, electrons with energies below the barrier height $\Delta_3$ are effectively filtered and, essentially, only the electrons with energies above the barrier height $E > \Delta_3$ will be able to traverse the length of first semiconductor layer 310.

As will be explained below, in an embodiment, the height of the barrier $\Delta_3$ in the first semiconductor layer 310 coincides with the peak DOS for the minority d-electrons (see FIGS. 2A and 2B). Note that the potential barrier $\Delta_3$ in the first semiconductor layer 310 may be manipulated, for example by controlling the donor concentration $N_{d1}$ of the first semiconductor layer 310. As previously noted, the DOS of minority d-electrons of the ferromagnetic layer 370 reaches maximum at energy level $E \approx E_F + \Delta_0$ (see FIGS. 2A and 2B). For simplicity, origin is chosen such that $E_F = 0$.

Then, at $E \approx \Delta_0$, the maximum DOS of minority d-electrons exceeds, by more than an order of magnitude, the DOS of electrons for all other types.

Thus, if the potential barrier height of the first semiconductor layer 310 is such that it coincides with $\Delta_0$ ($\Delta_3 \approx \Delta_0$), then the electrons from ferromagnetic layer 370 tunneling through the first δ-doped layer 315 and traversing the length d of the first semiconductor layer 310 will be composed of almost all minority d-electrons. In other words, the injected current will be almost 100% spin-polarized.

With reference to FIG. 3C, the operation of the device 300 is explained as follows. Under bias, almost 100% spin-polarized electrons are efficiently injected from the ferromagnetic layer 370 through the n$^+$-doped first δ-doped layer 315 into the n-doped first semiconductor layer 310. When the thickness d of the first semiconductor layer 310 is much less than diffusion length $L_{D1}$ of non-equilibrium carriers in this layer, the spin polarized electrons traverse the first semiconductor layer 310 and the n$^+$-doped second δ-doped layer 325 and accumulate in the thin narrower band gap p$^+$-doped second semiconductor layer 320. Simultaneously, holes are injected from the wide gap p$^+$-doped third semiconductor layer 330 into the second semiconductor layer 320 and the heavy holes (with projections of the effective spin $$\mu_{hh} = \pm\frac{3}{2})$$

accumulate there, blocked by the energy barrier $\Delta_4$, provided that $\Delta_4 >> k_B T$.

Highly polarized light is emitted due to radiative recombination of the holes with accumulated spin polarized electrons. This occurs when the spontaneous or stimulated radiation lifetime is less than the spin relaxation time of the electrons in the second semiconductor layer 320. This may be realized when concentration of injected electrons n in the layer 320 is relatively high, for example, above $10^{17}$ cm$^{-3}$.

Note that the minimal energy of the light holes (those with projections of the effective spin $$\mu_{hl} = \pm\frac{1}{2})$$

in the quantum well 320 exceeds $k_B T$ by design, so they cannot accumulate in the layer 320. The electrons with 100% spin polarization (with projection $$\mu_e = \frac{1}{2})$$

can only recombine with heavy holes, according to selection rule for angular momentum, in the channel $\mu_e + \mu_{hh} = -1$, since the photon polarization can only take the value P=−1. Another channel, $\mu_e + \mu_{hh} = 2$, is prohibited as well. Therefore, the emitted photons will all have the polarization P=−1, i.e. the radiation will be almost 100% polarized.

In another embodiment of the present invention, one or both first and second δ-doped layers 315 and 325 may be formed by growing a n$^+$-doped epitaxial layer on the n-doped first and second semiconductor layers 310 and 320.

The epitaxially grown δ-doped layers 315 and/or 325 are doped heavily as practicable and be as thin as practicable. In an embodiment, one or both of the first and second δ-doped layers 315 and 325 have a narrower energy band gap than the energy band gap of the first semiconductor layer 310 and that electron affinities of the δ-doped layers 315 and 325 be greater than an electron affinity of the first semiconductor layer 310 by a value close to $\Delta_0$.

If the δ-doped layer 315 is formed by epitaxial growth of a very thin heavily doped (i.e. n⁺ doped) and narrower energy band gap semiconductor layer, the parameters of the first δ-doped layer 315 i.e. its donor concentrations $N_d$ and its thickness $l_{+1}$ should satisfy the following conditions:

$$N_{d1} > 2\frac{\varepsilon_0 \varepsilon(\Delta_1 - \Delta_3)}{q^2 l_{+1}^2}, \quad l_{+1} \leq t_1 \tag{4}$$

The device 300 thus formed may also be described as having a FM1-$n_{\delta1}^+$-$n_1$-$n_{\delta2}^+$-$p_2^+$-$p_3^+$ structure corresponding to the layers 370, 315, 310, 325, 320, and 310, respectively. An example of such structure is FM1-Ni-$n_{\delta1}^+$-GaAs-$n_1$-$Ga_{1-x}Al_xAs$-$n_{\delta2}^+$-GaAs-$p_2^+$-GaAs-$p_3^+$-$Ga_{1-x}Al_xAs$. In other words, in this example, the n⁺-doped first and second δ-doped layers 315 and 325 and the second semiconductor layer 320 are formed from GaAs and the first and third semiconductor layers 310 and 330 are formed from $Ga_{1-x}Al_xAs$. Other example structures include Ni—$In_{1-x}Ga_xAs$—GaAs—$In_{1-x}Ga_xAs$—GaAs—GaAs; Ni(Fe)—$Cd_xHg_{1-x}Te$—CdTe—$Cd_xHg_{1-x}Te$—CdTe—$Cd_xHg_{1-x}Te$; and Ni(Fe)—$Zn_xCd_{1-x}Se$—ZnSe—$Zn_xCd_{1-x}Se$—ZnSe—$Zn_xCd_{1-x}Se$. As noted previously, the first and second δ-doped layers 315 and 325 should be transparent to tunneling electrons. This condition may be satisfied, for example, if the first and second δ-doped layers 315 and 325 are such that the thickness $l_{+1,2} \leq (1-2)$ nm and the donor concentration $N_{d1}^+ \geq 10^{20}$ cm⁻³ and $N_{d2} \geq 10^{19}$ cm⁻³.

Figure 3D:
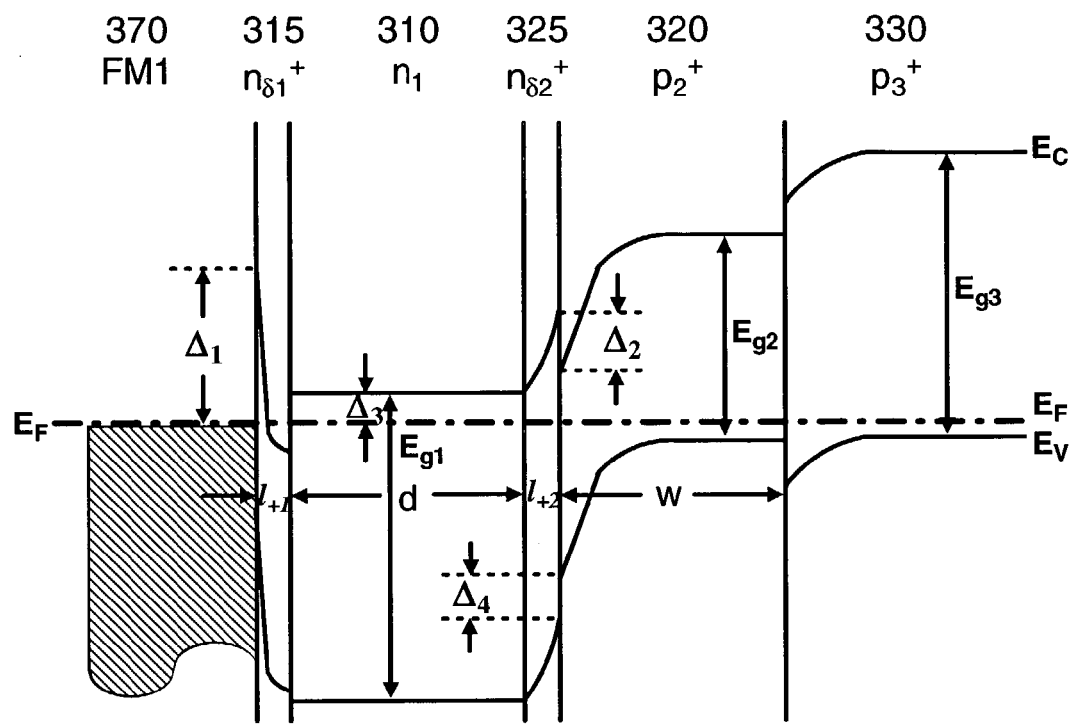
FIG. 3D illustrates an exemplary energy diagram of device shown in FIG. 3A along the line III—III, at equilibrium, wherein the δ-doped layers have narrower energy band gaps than that of the semiconductors.
Figure 3E:
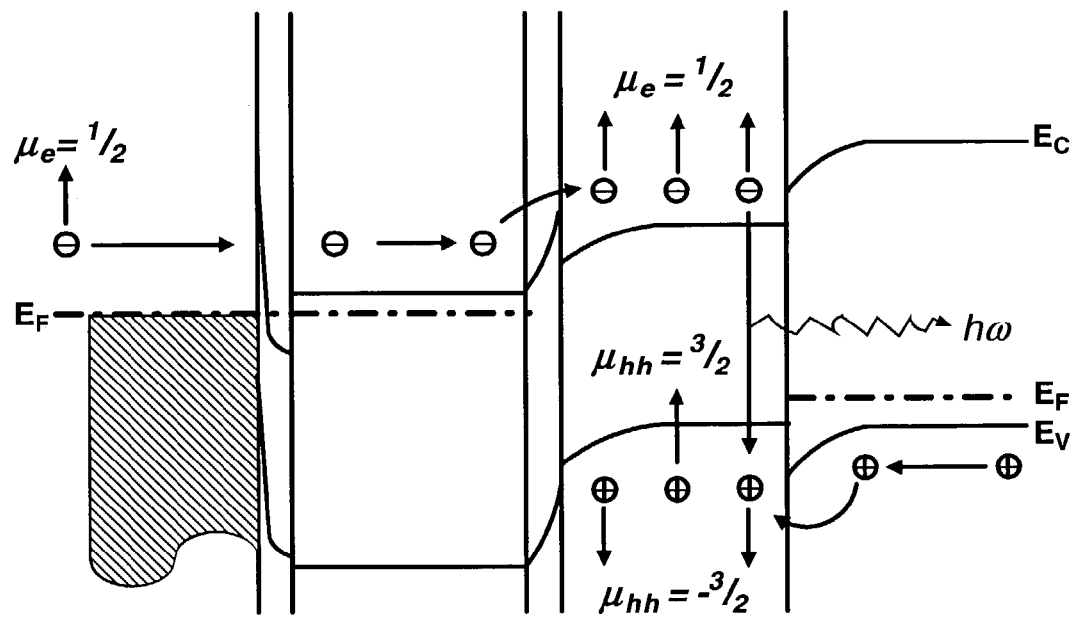
FIG. 3E illustrates an exemplary energy diagram of device shown in FIG. 3A along the line III—III, at bias, wherein the δ-doped layers have narrower energy band gaps than that of the semiconductors.

FIGS. 3D and 3E illustrate exemplary energy diagrams of the device 300 shown in FIG. 3A along the line III—III, at equilibrium and under bias voltage, respectively. In this embodiment, the first δ-doped layer 315 is assumed to be formed by epitaxial growth of narrower energy band gap semiconductor. The operation of this device 300 is similar to that as shown in FIGS. 3B and 3C, but the efficiency of the device may be even greater.

Figure 3F:
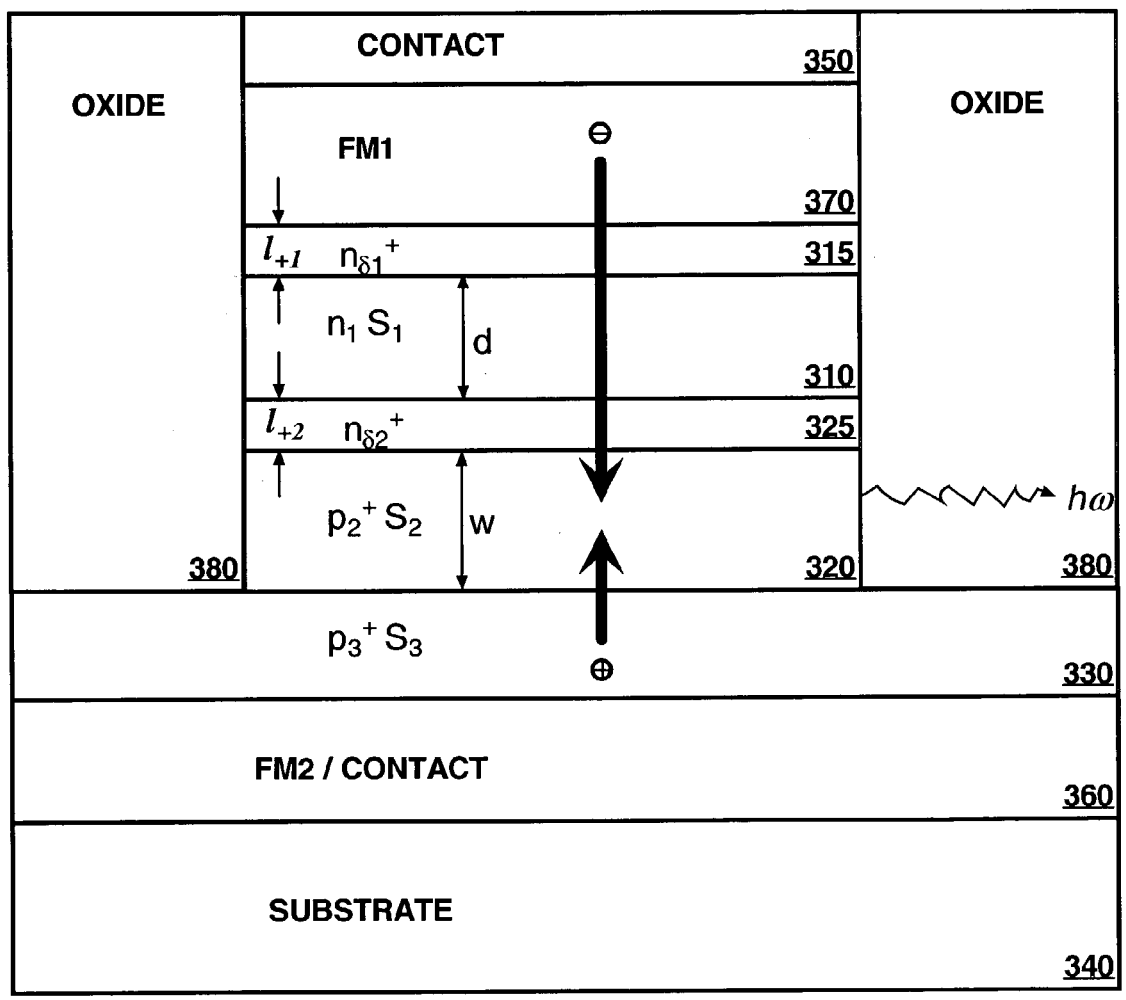
FIG. 3F illustrates a hetero laser and light-emitting device according to another embodiment of the present invention.

FIG. 3F illustrates another a hetero laser and light-emitting structure 300-2 according to another embodiment of the present invention. The device 300-2 is similar to the device 300 shown in FIG. 3A, except that the first and second electrical contacts 350 and 360 are placed as shown. The operation of the device 300-2 is similar and need not be repeated here. The electrical contact 350 and 360 are placed as shown. The bottom electrode 360 can be made magnetic, FM2, to inject spin-polarized holes through the second semiconductor layer 320 (p⁺-$S_2$). In an embodiment, the thickness of this layer is much smaller than the spin diffusion length of holes in the semiconductor layer 320, W<<$L_{hs}$= $\overline{D_h \tau_{hs}}$, where $\tau_{hs}$ is the relaxation time of hole spin and $D_h$ is the hole diffusion coefficient in the third semiconductor layer 330.

Figure 4A:
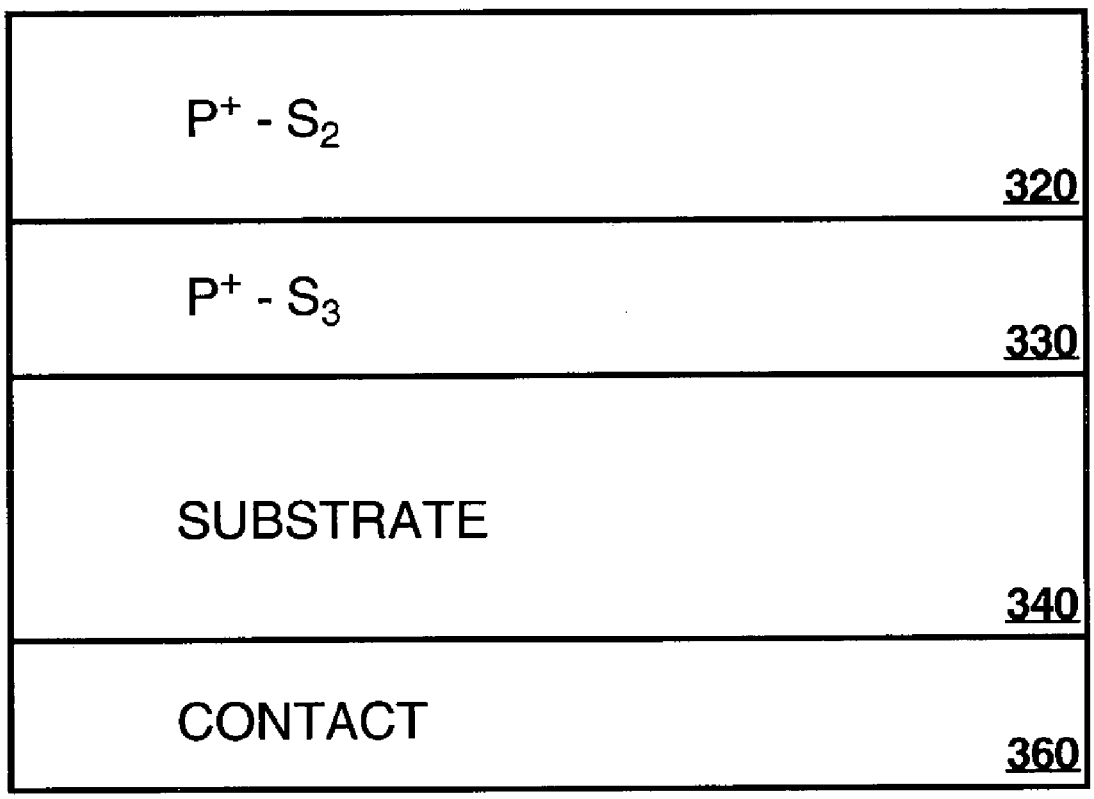
Figure 4B:
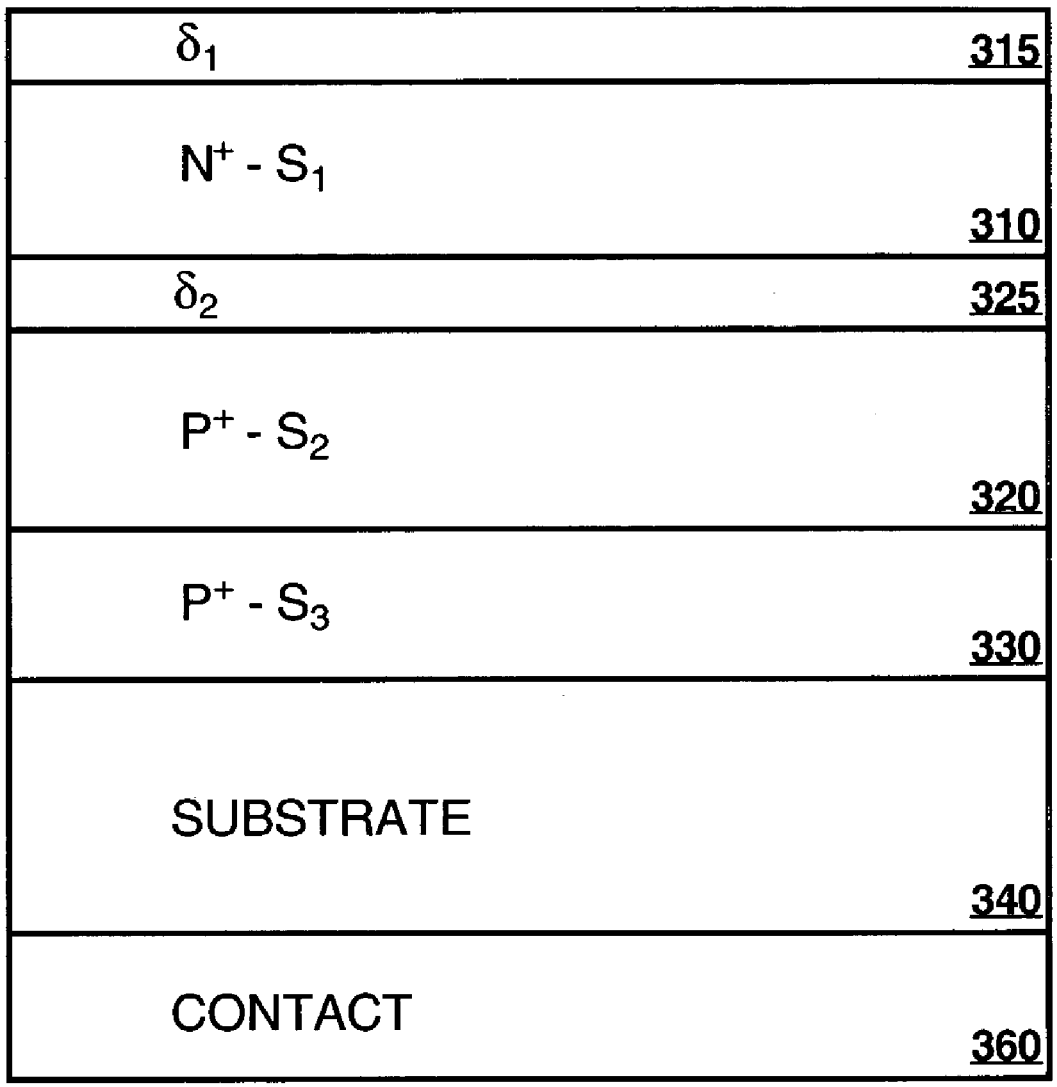

FIGS. 4A–4C illustrate an exemplary method of manufacturing the device 300 shown in FIG. 3A. As shown in FIG. 4A, the contact second contact 360 and the substrate 340 may be formed. The substrate 340 may be planarized. Then the third semiconductor layer 330 may be formed on the substrate 340 and the second semiconductor layer 320 may be formed on the third semiconductor layer 330 may be formed by epitaxial or molecular growth. Materials to form the third semiconductor layer 330 may be deposited, sputtered, fired on the substrate 340. Likewise, the second semiconductor layer 320 may also be deposited, sputtered, fired on the third semiconductor layer 330. One or both of the third and second semiconductor layers 330 and 320 may be planarized.

Then as shown in FIG. 4B, the first and second δ-doped layers 315 and 325 and the first semiconductor layer 310 may be formed. In one embodiment, the second δ-doped layer 325 may be formed by epitaxial or molecular growth. The second δ-doped layer 325 may also be deposited, sputtered, or fired onto the second semiconductor layer 320. Then the first semiconductor layer 310 may be deposited, fired, or sputtered onto the second δ-doped layer 325. Then the first δ-doped layer 315 may be formed by epitaxial or molecular growth, or may be deposited (e.g., by molecular deposition, liquid epitaxy, or MOCVD), sputtered, or fired onto the first semiconductor layer 310. Note that each of the first and second δ-doped layers 315 and 325 and the first semiconductor layer 310 may be planarized. Also, the first and second δ-doped layers 315 and 325 may be doped more heavily as compared to the first semiconductor layer 310.

In another embodiment, the first semiconductor layer 310 may be formed on the second semiconductor layer 320 and the first and second δ-doped layers 315 and 325 may be formed by heavily doping appropriate portions of the first semiconductor layer 310 or by epitaxial or molecular growth.

Then as shown in FIG. 4C, the ferromagnetic layer 370 may be formed, again by epitaxial or molecular growth, or may be deposited, sputtered, or fired onto on the first δ-doped layer 315. The ferromagnetic layer 370 may be planarized. Then as shown, the first electrode 360 may be formed by sputtering, firing, or depositing materials on the ferromagnetic layer 370.

Figure 5A:
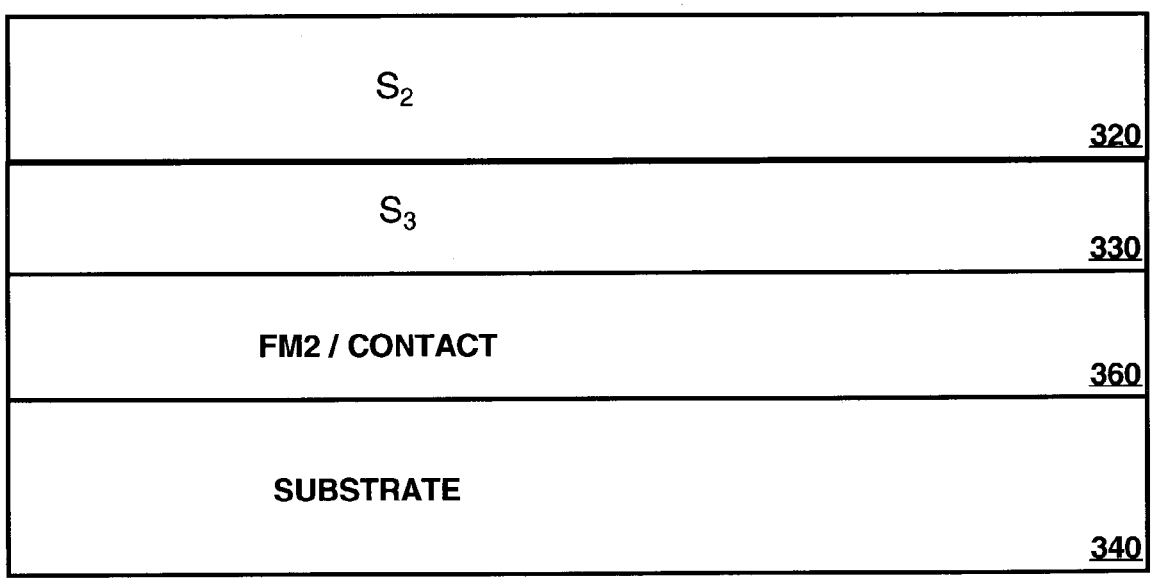

FIGS. 5A–5D illustrate an exemplary method of manufacturing the device 300-2 shown in FIG. 3F. As shown in FIG. 5A, the substrate 340 may be formed and the contact second contact 360 may be formed on the substrate 340. The second contact 360 may be deposited, sputtered, fired on the substrate 340 and may be planarized. The second contact 360 may be from a ferromagnetic material. Then the third semiconductor layer 330 may be formed on the second contact 360 and the second semiconductor layer 320 may be formed on the third semiconductor layer 330. Materials to form the third semiconductor layer 330 may be deposited, sputtered, fired on the substrate 340. Likewise, the second semiconductor layer 320 may also be deposited, sputtered, fired on the third semiconductor layer 330. One or both of the third and second semiconductor layers 330 and 320 may be planarized.

Then as shown in FIGS. 5B and 5C, the steps the form the first and second δ-doped layers 315 and 325, the first semiconductor layer 310, the ferromagnetic layer 370, and the electrical contact 350 are similar to the steps shown in FIGS. 4B and 4C, and thus the details need not be repeated here.

Figure 5D:
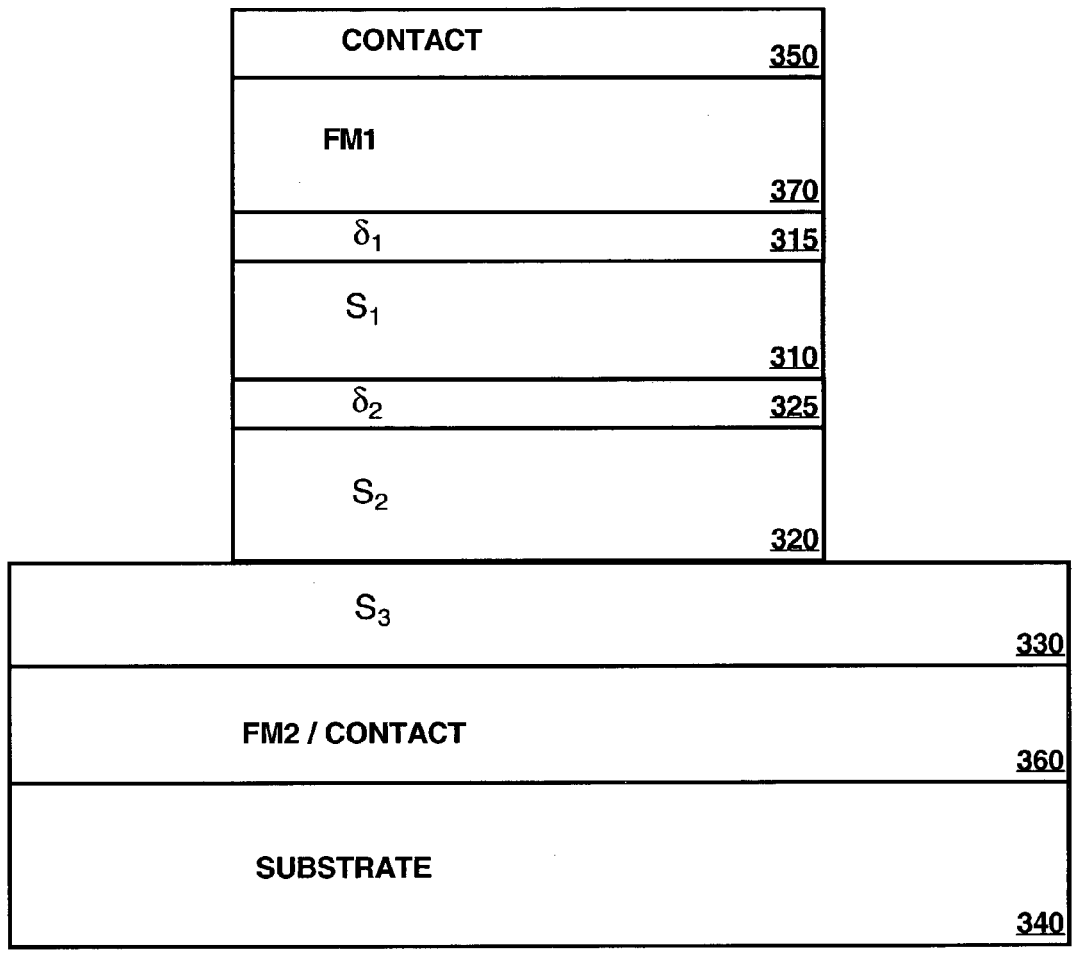
Figure 5E:
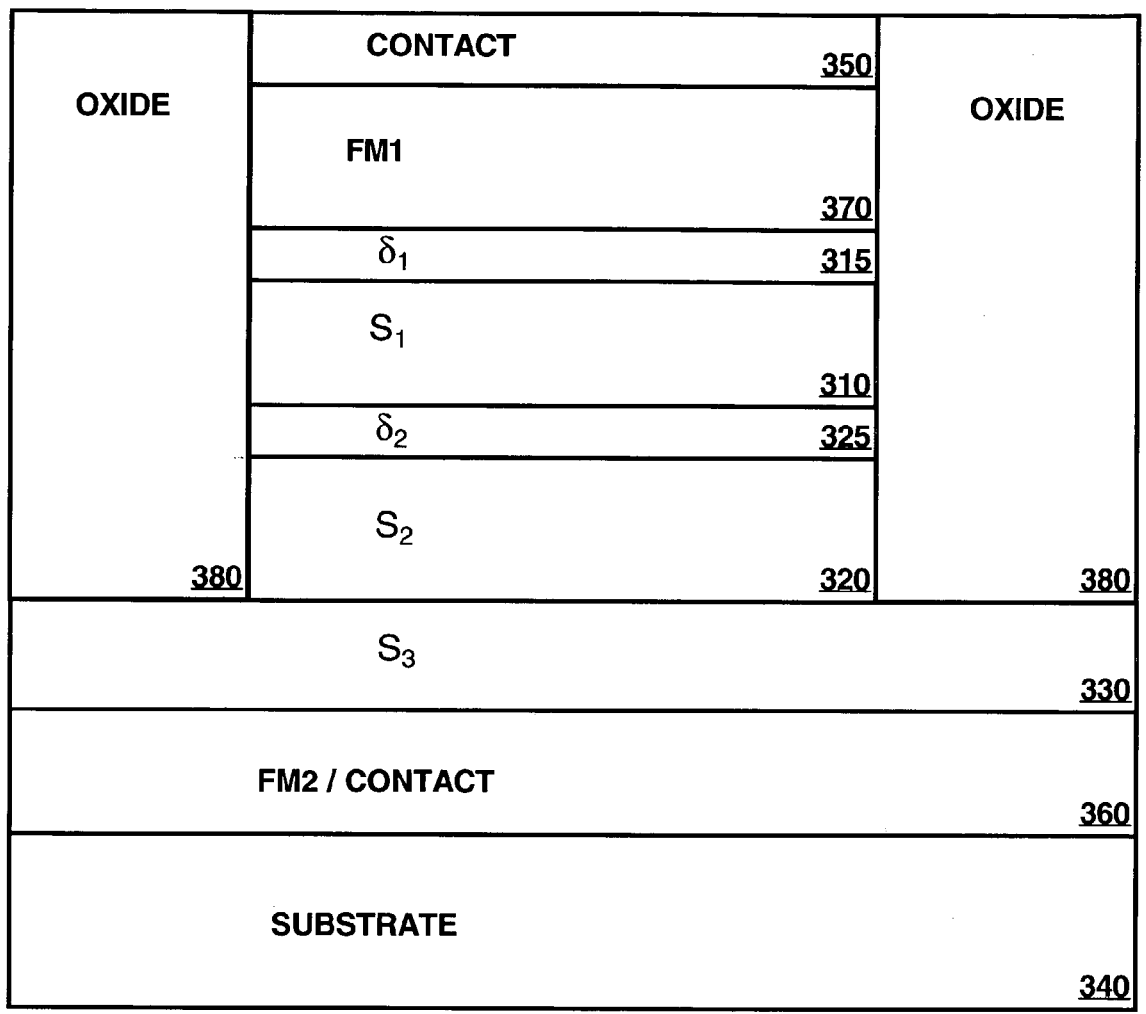

Then the contact 350, ferromagnetic layer 370, first and second δ-doped layers 315 and 325, and first and second semiconductor layers 310 and 320 are etched to expose the third semiconductor 330 as shown in FIG. 5D. The etched areas are then filled with oxides 380 as shown in FIG. 5E.

What has been described and illustrated herein are preferred embodiments of the invention along with some of its variations. The terms, descriptions and figures used herein are set forth by way of illustration only and are not meant as limitations. Many variations are possible within the spirit and scope of the invention, which is intended to be defined by the following claims—and their equivalents—in which all terms are meant in their broadest reasonable sense unless otherwise indicated.

What is claimed is:

1. A hetero-laser and light-emitting device, comprising:
a first semiconductor layer being doped with a first dopant type;
a second semiconductor layer being doped with a second dopant type and being formed below the first semiconductor layer;
a third semiconductor layer being doped with the second dopant type and being formed below the second semiconductor layer;
a ferromagnetic layer formed above the first semiconductor layer;
a first δ-doped semiconductor layer being doped with the first dopant type and being formed between the ferromagnetic layer and the first semiconductor layer; and
a second δ-doped semiconductor layer being doped with the first dopant type and being formed between the first semiconductor layer and the second semiconductor layer.

2. The device of claim 1, wherein the first dopant type is negative and the second dopant type is positive.

3. The device of claim 1, wherein a thickness of the second semiconductor layer is less than a diffusion length $L_{D2}$ of non-equilibrium carriers in the second semiconductor layer.

4. The device of claim 3, wherein the thickness w of the second semiconductor layer is expressed by:

$$w < L_{D2};$$

and $$w_0 > w \geq w_0 \sqrt{m_{pl}/m_{ph}};$$

where $m_{pl}$ represents an effective mass of light holes, $m_{ph}$ represents an effective mass of heavy holes, $w_0 = h/\sqrt{2m_{pl}k_BT}$, h represents Plank's constant, $k_B$ represents the Boltzmann constant, and T is a temperature of the device.

5. The device of claim 1, wherein at least one of the first and second δ-doped layers is formed by doping a portion of the first semiconductor layer.

6. The device of claim 5, wherein the first δ-doped layer satisfies a condition $$N_{d1} l_{+1}^2 \approx 2 \frac{\varepsilon_0 \varepsilon (\Delta_1 - \Delta_3)}{q^2}$$

and the second δ-doped layer satisfies a condition $$N_{d2} l_{+2}^2 \approx 2 \frac{\varepsilon_0 \varepsilon \Delta_2}{q^2},$$

wherein $N_{d1}$ and $l_{+1}$ represent a donor concentration and a thickness of the first δ-doped layer; $N_{d2}$ and $l_{+2}$ represent a donor concentration and a thickness of the second δ-doped layer; q represents the positive elementary charge; ε represents a relative permittivity of the first semiconductor layer; $\varepsilon_0$ represents the permittivity of vacuum; $\Delta_1$ represents a potential barrier height on interfaces between the ferromagnetic layer and the first δ-doped layer; $\Delta_2$ represents a step of a potential barrier height at an interface between the first and second semiconductor layers; $\Delta_3$ represents a height of a potential barrier formed in the first semiconductor layer.

7. The device of claim 6, wherein the potential barrier height $\Delta_3$ formed in the first semiconductor layer corresponds to a peak in a density of minority d electrons in the ferromagnetic layer.

8. The device of claim 7, wherein the condition $$N_{d1} l_{+1}^2 \approx 2 \frac{\varepsilon_0 \varepsilon (\Delta_1 - \Delta_3)}{q^2}$$

is satisfied to an extent that a dispersion of $\Delta_3$ is substantially equal to a width of a peak in the density of states of minority d electrons of the ferromagnetic layer.

9. The device of claim 6, wherein at least one of the following is true:
the thicknesses $l_{+1}$ and $l_{+2}$ of the first and second δ-doped layers range substantially less than or equal to 2 nanometers; and
the donor concentrations $N_{d1}$ and $N_{d2}$ of the first and second δ-doped layers are greater than or substantially equal to between $10^{20}$ cm$^{-3}$ to $10^{21}$ cm$^{-3}$.

10. The device of claim 1, wherein the ferromagnetic layer is formed from at least one of Ni, Fe, Co, and alloys there of.

11. The device of claim 1, wherein a thickness of the ferromagnetic layer is less than or substantially equal to a typical width of a magnetic domain wall.

12. The device of claim 1, wherein the second semiconductor layer is formed from semiconductors with direct optical transitions.

13. The device of claim 12, wherein the second semiconductor layer is formed from at least one of, GaAs, AlGaAs, InGaAs, InGaPAs, InAs, GaSb, InSb, InGaSb, AlAs, AlSb, ZnTe, CdTe, GhCdTe, and alloys thereof.

14. The device of claim 12, wherein a thickness of the second semiconductor layer is less than a diffusion length of non-equilibrium carriers of the second semiconductor layer.

15. The device of claim 1, wherein:
an energy band gap of the first semiconductor layer is greater than an energy band gap of the second semiconductor layer; and
an energy band gap of the third semiconductor layer is greater than the energy band gap of the second semiconductor layer.

16. The device of claim 15, wherein the first, second, and third semiconductor layers form double heterostructures.

17. The device of claim 16, wherein the double heterostructure is at least one of $Al_yGa_{1-y}As$—GaAs—$Al_xGa_{1-x}As$ and $In_yGa_{1-y}As$—InGaAs—$In_xGa_{1-x}As$, where x and y refer to a chemical composition of each relevant material.

18. The device of claim 1, wherein a thickness of the first semiconductor layer is less than a spin diffusion length of electrons in the first semiconductor layer.

19. The device of claim 1, wherein at least one of the first and second δ-doped layers is formed growing n$^+$-doped epitaxial layer on the first and second semiconductor layers.

20. The device of claim 1, wherein at least one of an energy band gap of the first and second δ-doped layers is narrower than an energy band gap of the first and second semiconductor layers.

21. The device of claim 20, wherein the first δ-doped layer satisfies a condition $$N_{d1} \approx 2\frac{\varepsilon_0\varepsilon(\Delta_1 - \Delta_3)}{q^2 l_{+1}^2},$$

wherein $N_{d1}$ and $l_{+1}$ represent a donor concentration and a thickness of the first δ-doped layer, q represents the positive elementary charge; $\epsilon$ represents a relative permittivity of the first semiconductor layer; $\epsilon_0$ represents the permittivity of vacuum; $\Delta_1$ represents a potential barrier height on interfaces between the first ferromagnetic layer and the first δ-doped layer; and $\Delta_3$ represents a height of a potential barrier formed in the first semiconductor layer.

22. The device of claim 21, wherein the potential barrier height $\Delta_3$ formed in the semiconductor layer corresponds to a peak in a density of minority d electrons in the first ferromagnetic layer and the second ferromagnetic layer.

23. The device of claim 1, further comprising;
a substrate formed below the third semiconductor layer;
a first electrode formed and electrically connecting to the ferromagnetic layer; and
a second electrode formed and electrically connecting to the substrate.

24. The device of claim 1, further comprising:
a substrate formed below the third semiconductor layer;
a first electrode formed above and electrically connecting to the ferromagnetic layer;
a second electrode formed in between the third semiconductor layer and the substrate and electrically connecting to the third semiconductor layer; and
an oxide formed above the third semiconductor layer and on sides of the first and second semiconductor layers, first and second δ-doped layers.

25. The device of claim 24, wherein the ferromagnetic layer is a first ferromagnetic layer and the second electrode is a second ferromagnetic layer.

26. A method to form a hetero-laser and light-emitting device, comprising:
forming a first semiconductor layer doped with a first dopant type;
forming a second semiconductor layer doped with a second dopant type and located below the first semiconductor layer;
forming a third semiconductor layer doped with the second dopant type and located below the second semiconductor layer;
forming a ferromagnetic layer above the first semiconductor layer;
forming a first δ-doped layer being doped with the first dopant type and located between the ferromagnetic layer and the first semiconductor layer; and
forming a second δ-doped layer being doped with the first dopant type and located between the first semiconductor layer and the second semiconductor layer.

27. The method of claim 26, wherein the first dopant type is negative and the second dopant type is positive.

28. The method of claim 26, wherein at least one of the first and second δ-doped layers is formed by doping a portion of the second semiconductor layer.

29. The method of claim 26, wherein at least one of the first and second δ-doped layers is formed growing $n^+$-doped epitaxial layer on the first and second semiconductor layers.

30. The method of claim 26, wherein at least one of the ferromagnetic layer, the first semiconductor layer, the second semiconductor layer, the third semiconductor layer, the first δ-doped layer, the second δ-doped layer is formed by at least one of deposition, liquid epitaxy, MOCVD, firing, and sputtering.

31. The method of claim 26, further comprising;
forming a substrate below the third semiconductor layer;
forming a first electrode above and electrically connecting to the ferromagnetic layer; and
forming a second electrode below and electrically connecting to the substrate.

32. The method of claim 26, further comprising:
forming a substrate formed below the third semiconductor layer;
forming a first electrode above and electrically connecting to the ferromagnetic layer;
forming a second electrode formed in between the third semiconductor layer and the substrate and electrically connecting to the third semiconductor layer; and
forming an oxide formed above the third semiconductor layer and on sides of the first and second semiconductor layers, first and second δ-doped layers.

33. A method of emitting polarized light, the method comprising:
providing a hetero-laser and light-emitting device, wherein the devices comprises a first semiconductor layer doped with a first dopant type, a second semiconductor layer being doped with a second dopant type and located below the first semiconductor layer, a third semiconductor layer being doped with the second dopant type and located below the second semiconductor layer, a ferromagnetic layer above the first semiconductor layer, a first δ-doped layer being doped with the first dopant type and located between the ferromagnetic layer and the first semiconductor layer, and a second δ-doped layer being doped with the first dopant type and located between the first semiconductor layer and the third semiconductor layer; and
applying a bias voltage between the ferromagnetic layer and the third semiconductor layer.

34. The method of claim 33, wherein the first dopant type is negative and the second dopant type is positive.

* * * * *